United States Patent [19]

Goldie

[11] 4,266,202

[45] May 5, 1981

[54] RECEIVER PROTECTOR HAVING MEANS FOR SUPPRESSING INTERNALLY GENERATED NOISE SIGNAL FREQUENCIES

[75] Inventor: Harry Goldie, Randallstown, Pa.

[73] Assignee: Westinghouse Electric Corp., Pittsburgh, Pa.

[21] Appl. No.: 61,128

[22] Filed: Jul. 26, 1979

[51] Int. Cl.³ .......................... H01P 1/14; H04B 1/10
[52] U.S. Cl. ..................................... 333/13; 333/208; 455/81
[58] Field of Search ............... 333/13, 17 L, 208, 212; 315/39; 455/81, 82; 370/24, 32

[56] References Cited

U.S. PATENT DOCUMENTS

| 2,541,375 | 2/1951 | Mumford | 333/208 |
| 4,027,255 | 5/1977 | Blakeney et al. | 333/13 |

Primary Examiner—Paul L. Gensler
Attorney, Agent, or Firm—R. M. Trepp

[57] ABSTRACT

A receiver protector is described incorporating a waveguide containing several isolation stages followed by at least one iris plate filter.

The invention overcomes the problem of RF or microwave leakage power of out-of-band frequencies some of which may be generated by non-linear elements in the prior isolation stages of the receiver protector.

14 Claims, 11 Drawing Figures

RECEIVER PROTECTOR HAVING MEANS FOR SUPPRESSING INTERNALLY GENERATED NOISE SIGNAL FREQUENCIES

GOVERNMENT CONTRACT

The Government has rights in this invention pursuant to Contract No. F33657-75-C0310 awarded by the Department of the Air Force.

BACKGROUND OF THE INVENTION

1. Field of the Invention

This invention relates to receiver protectors of the high power plasma/diode fast-acting limiter type.

2. Description of the Prior Art

Receiver protectors are used in the microwave duplexing art for permitting the use of a single antenna for transmission of high power output pulses and reception of low power received signals via a common microwave waveguide. Plasma within the receiver protector automatically inhibits the transmission of high-power wide-band-width electromagnetic wave energy in the direction from the antenna to the receiver thus preventing the transmitted pulse power from reaching and damaging the receiver. The receiver protector also permits the low-power received signal to come from the antenna through the microwave waveguide to be routed to the receiver.

The receiver protector may also have non-linear elements which function to short circuit the receiver when a high power pulse from the transmitter is routed to and reflected from the antenna and thus prevents a high energy pulse from damaging the receiver as described in an article entitled "What's New With Receiver Protectors?" by Harry Goldie in Microwaves, Vol. 15, No. 1, pp. 1-5. January 1976. The bandwidth of the receiver protector should equal or exceed the bandwidth of the transmitter pulse, otherwise, the out-of-bandwidth portion of the pulse will enter and possibly damage the receiver. In one known conventional receiver protector design, a number of diode limiters are placed across the output end of the receiver protector to prevent leakage of the transmitter pulse into the receiver input, which may result in burn out of the receiver input amplifier components. With the advent of transmitting pulses of extremely fast rise times on the order to 5 to 10 nanoseconds, the pulse waveform at the RF output of the receiver protector such as described in U.S. Pat. No. 4,027,255 issued on May 31, 1977 to H. K. Blakeney, et al. and assigned to assignee herein, may contain a bandwidth of several GHz which exceeds the in-band isolation bandwidth of the diode limiter section which is normally on the order of only 1 GHz. Consequently, the diode limiters cannot attenuate the "out-of-band" energy of the transmitted pulse. The fast risetime of the pulses causes high gap voltages to be generated across the gas discharge cones of this type of receiver protector during electron avalanching which results in a strong wideband noise energy burst being generated; the in-band energy is properly limited by the diode limiters whereas the out-of-band energy passed to the receiver becomes prominent. The out-of-band energy can exceed the safe leakage power of a sensitive low noise FET amplifier.

Measurements in the laboratory of a conventional receiver protector such as described in U.S. Pat. No. 4,027,255 showed that the transmitted output spike waveform contained a much wider band of frequencies, over 4 GHz, than the input test source contained. Investigation showed that the receiver protector itself generated a full waveguide band of frequencies and that the power amplitude of these frequencies exceeded the power amplitude of the in-band power pulse at the output port. In addition, the bandwidth of the diode limiter stage was only 1 GHz wide and thus did not attenuate the "out-of-band" energy. Such a problem was not expected to exist and was unknown prior to this receiver protector design and represented a new effect. This phenomena is caused by a combination of several factors: (a) fast rise (8 to 10 nanoseconds) incident pulses which cause high gap voltages across the gas discharge cones during discharge avalanching, resulting in strong wideband noise energy being generated; (b) in-band energy is properly limited due to the large number of varactor limiters (i.e., diode spike clippers) so that out-of-band energy becomes prominent (as seen at the output port on a spectrum analyzer set for 4 GHz bandwith) relative to in-band energy and, finally; (c) the safe leakage power for sensitive low noise FET amplifiers (NEC 388 manufactured by Nippon Electric Corp. of Japan; 0.5 micron gate-to-source length) is 100 milliwatts for 3 nanosecond spikes and 50 nw peak flat leakage which makes the amplifier subject to burnout when the excessive out-of-band energy leaks into it.

It was the combination of (a), (b) and (c) above which showed that a new type of receiver protector is required for receivers which use state-of-the-art low noise amplifier field-effect transistor (FET) front ends.

This invention provides an improvement to the commonly available type of receiver protector wherein its above-threshold bandwidth is increased sufficiently to inhibit leakage of high power transmitter pulses into receivers when said pulses contain frequencies which have a bandwidth wider than that of a conventional receiver protector.

SUMMARY OF THE INVENTION

In accordance with the present invention, a receiver protector is provided for protecting a receiver from microwave signals coupled into said receiver protector from a source of microwave signals, wherein undesired noise signal frequencies are generated by non-linear elements in said receiver protector, comprising

- a waveguide of a predetermined electrical wavelength having an input end wherein the microwave signals are coupled into the waveguide from the source of microwave signals and an output end wherein the noise signal frequencies are coupled to the receiver;
- first means for isolating energies associated with a first predetermined range of noise signal frequencies within the bandwidth of the receiver;
- second means for isolating energies associated with a second and third predetermined range of noise signal frequencies outside the bandwidth of the receiver, wherein the first range of frequencies extends between second and third range of frequencies;
- the non-linear elements, said first isolating means, and the second isolating means disposed in the waveguide in a predetermined arrangement.

DESCRIPTION OF THE PREFERRED EMBODIMENT

Figure 1:
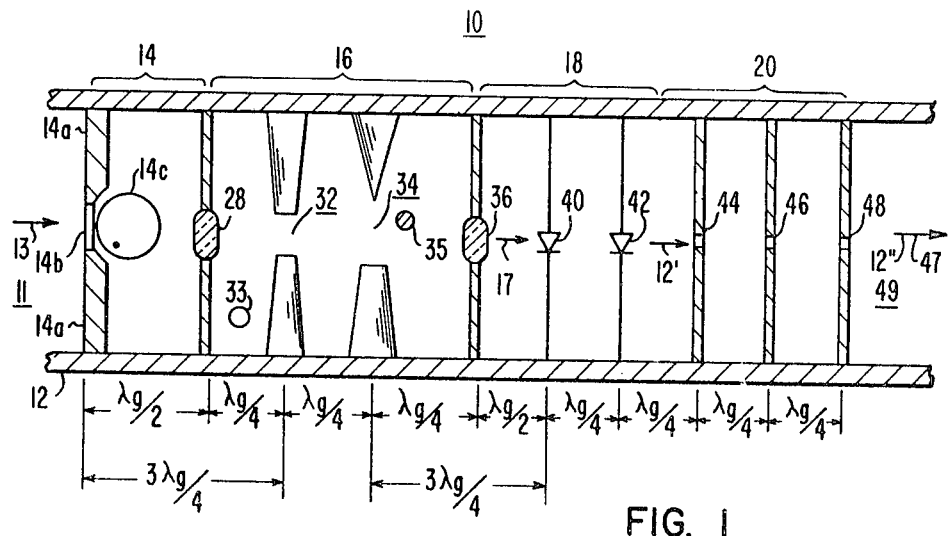
FIG. 1 is a drawing of one embodiment of the invention.
Figure 2C:
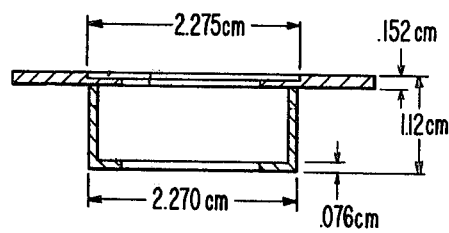
FIG. 2C is a section of FIG. 2A taken along line IIC—IIC.
Figure 2D:
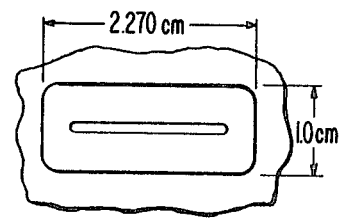
FIG. 2D is a front view of the iris slit of FIG. 2B.
Figure 2A:
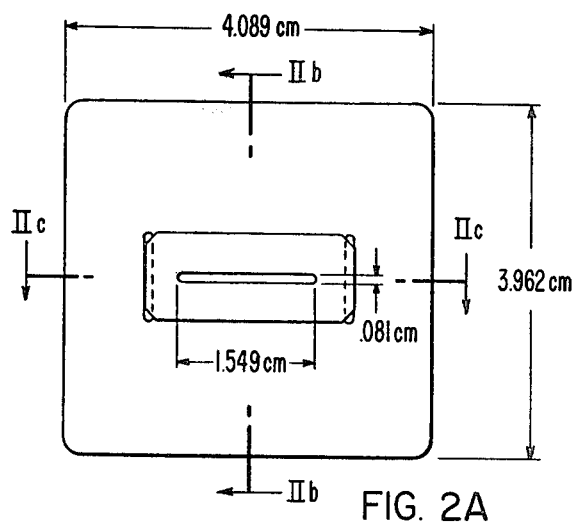
FIG. 2A is the front view of a dual iris filter.
Figure 2B:
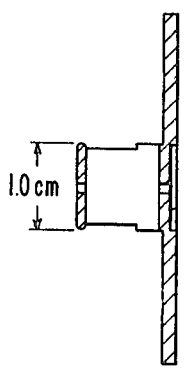
FIG. 2B is a section of FIG. 2A taken along line IIB—IIB.

Referring now to the drawings and in particular to FIG. 1, a multi-stage, waveguide-type receiver protector 10 comprises a rectangular cross-sectional waveguide 12 having an input end 11 suitable for passing RF energy indicated by arrow 13 and an output end 49 suitable for passing radio frequency and microwave energy indicated by the arrow 47. The RF input energy may be introduced to input end 11 by an arrangement of a radar antenna connected to a circulator duplexer having a connection to the input end 11 of receiver protector 10. Another part of the circulator may be connected to the transmitter, and still another part to a suitable load for properly terminating impedances. The RF output energy at output end 49 may be conventionally introduced to another circulator connection having one output part connected to the receiver and another output part connected to a suitable impedance termination load. Within waveguide 12 of receiver protector 10 are non-linear elements in four sequential stages 14, 16, 18 and 20 disposed between its input end 11 and output end 49. The four sequential stages are: a vial stage 14, an ignitor stage 16, an RF diode limiter stage 18, and an iris filter stage 20.

Waveguide 12 has a characteristic center frequency, $f_o$, for RF energy propagation. Except where otherwise identified, all references to wavelength, $\lambda_g$, are to be understood to refer to electrical wavelength at frequency $f_o$. Stages 14, 16, and 18 are conventional as described in U.S. Pat. No. 4,027,255 which is incorporated herein by reference.

The RF energy at input end 11 is coupled into stage 14 by a metallic wall 14a containing a slit type iris 14b. A cylindrical tubing or vial 14c, comprised of, for example, quartz, containing halogen gases under a predetermined low pressure, is recessed into the rear side of wall 14a in alignment with iris 14b. An example of the power rating of vial 14c is that the characteristic minimum sustaining power is 400 watts. Minimum sustaining power is the minimum power to keep the vial 14c stably turned on. The common quality of appropriate halogen gaseous mediums is the existence of free electrons in their atomic structure, which gives them the desired property of quick extinction of the plasma gaseous discharge when the excess RF energy drops below their turnoff threshold. The turn-off threshold is somewhat lower than the rated sustaining power. The RF energy at input end 11 thus is permitted to pass to the output end 49 and on to the receiver after the transmitter signal terminates. The plasma gaseous discharge is the cause of the short-circuiting of RF power which protects the receiver when the transmitter is keyed or on.

Stage 16 is filled with a gas 33 comprised of a conventional combination of, for example, krypton (Kr) or argon (A), ammonia vapor ($NH_3$) and water vapor ($H_2O$). The gas 33 is retained within stage 16 by low $-Q$ windows 28 and 36 which are hermetically sealed respectively to waveguide walls 12 forming a gas tight chamber therebetween.

Stage 16 includes a conventional gas discharge limiter medium power stage 32 and a radioactive tritium (titanium tritide) primed ignitor stage 34. The initiatory electrons available from the beta emission from the titanium tritide 35 provide the quick start-up of a plasma gaseous discharge to protect the receiver from initial signals from the radar transmitter. As is well known, the reason for the gaseous medium in stage 16 is that halogen gases may not be used because their attaching nature would cause deterioration of the metallic structure associated with the discharge gap and support of the radioactive primer material. A typical minimum sustaining power of the limiter stage 34 is in the range of 0.2–0.8 watt, such a range being inherent to this type of device.

Stage 18 is comprised of two diode limiters 40 and 42 respectively and are connected in the conventional manner to provide filtering action for the frequencies which are in the "in-band" bandwidth of the RF input pulse. Diodes having desired RF "hard limiting" qualities are employed and may be, for example, conventional varactors.

Limiter 40 is disposed three-quarters wavelength or 270° nominally from the position of the tritium primed ignition stage 34 in order to place the gap of stage 34 at a point of a maxima in reflected energy from limiter 40 so that limiter 40 will appear to be limiting the RF flow to a much lower value than the 100 milliwatts minimum sustaining power of limiter 40 and therefore below the turnoff threshold of stage 34 in steady state operation.

Limiter 42 is located one-quarter wavelength from limiter 40 where it provides another stage of limiting to limit the output power which passes out from receiver protector 10 to acceptable limits for the receiver. A pair of diode limiters has been experimentally determined to be the optimum number for use in this embodiment although more or less limiters may be employed. Also, the use of only one limiter here has been determined to be insufficient for adequate protection of conventional radar receivers. Although limiters 40 and 42 are disclosed as passive (i.e. self-activating) power limiting stages, it will be appreciated by those skilled in the art that they could be d.c. or pulse gated just as well.

Stage 20 is comprised of passive iris plate filters 44, 46, and 48 respectively and provide filtering action for the frequencies which are in the "out-of-band" bandwidth of the RF input pulse. Iris plate filters 44, 46, 48 may each be a flat metal plate with a slot of predetermined width and height. Additional single-stage filters may be added provided that physical space is not a limiting factor and that the insertion loss due to the additional plates is acceptable. Experience has shown that more than a total of three iris plate filters is usually not necessary and that the use of one filter plate ordinarily may not provide sufficient out-of-band filtering for a conventional sensitive FET receiver. Within the X-band of microwave frequencies, the insertion loss is on the order of 0.08 dB per plate; at C-band, it is on the order of 0.05 dB per plate. Typical $Q_L$ for the iris plates is 2.2 to 3.2.

FIGS. 2A, 2B, 2C and 2D illustrate a dual iris configuration suitable for iris plate filters 44 and 46 although individual iris configuration units may be employed in lieu of the dual iris shown. The dimensions are shown in FIGS. 2A through 2D for one embodiment of a dual iris plate filter.

The individual elements of the receiver-protector shown in FIG. 1 are spaced at one-quarter wavelength ($\lambda_g/4$) or at three-quarter wavelength ($3\lambda_g/4$); it will be readily appreciated that any such specified interval may be respectively an odd integral number or an integral number of such spacing lengths, i.e. $(2N-1) \lambda_g/4$, where N is an integral number and preferably one or two. For example, the gas discharge limiter 32 is positioned $3\lambda_g/4$ further along in the direction of RF flow from plasma limiter iris 14b and $\lambda_g/4$ from window 28. Plasma limiter 34 is positioned $\lambda_g/4$ further along in the direction of RF flow from plasma limiter 32. Diode limiter 40 is positioned $3\lambda_g/4$ further along in the direction of RF flow from limiter 34 and $\lambda_g/2$ from window 36. Iris plate filters 44, 46, and 48 are successively positioned $\lambda_g/4$ further along in the direction of RF flow from diode limiter 42; additional iris filters would likewise be positioned $(2N-1) \lambda_g/4$ from the preceeding filter so that there would be a space length of $(2N-1) \lambda_g/4$ between each iris filter for optimum performance.

Figure 3:
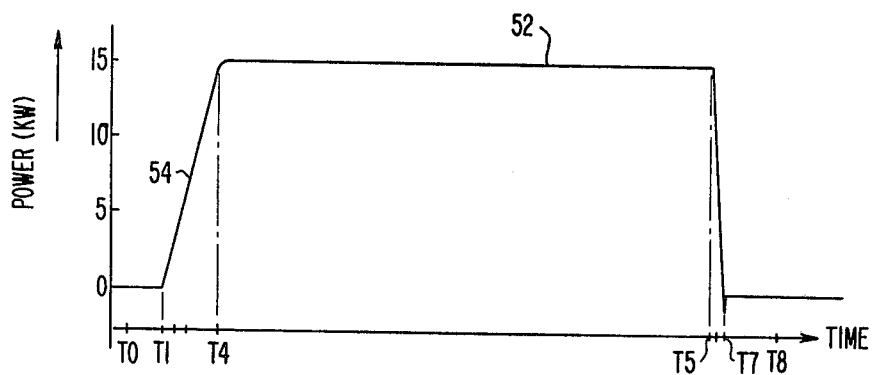
FIG. 3 is the typical transmitter pulse wave shape at the input to the embodiment of FIG. 1.
Figure 4:
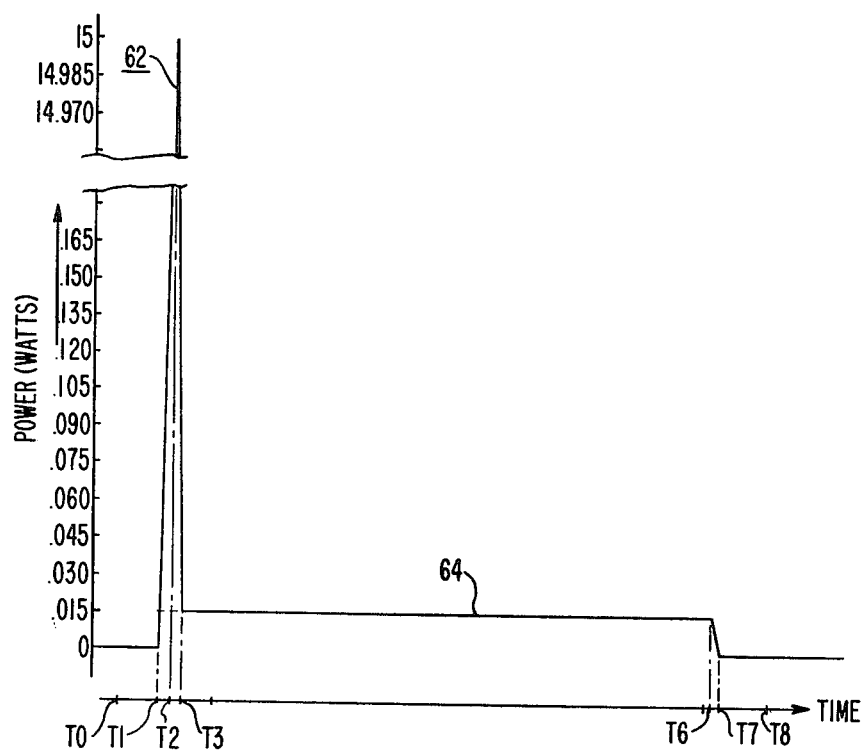
FIG. 4 is the transmitter pulse wave shape at the output of the ignitor state 16 of the embodiment of FIG. 1.

In the operation of the preferred embodiment of receiver protector 10, as shown in FIG. 1, the RF input is a high power pulse, as shown in FIG. 3, having a typical flat-top 52 from time T4 to T5 with a peak power on the order of 15 kw, a rise-time for the leading edge 54 from time T1 to T4 on the order of 5 to 10 nanoseconds, and a pulse width from T1 to T7 on the order of ¼ to 100 microseconds. In FIG. 3 the ordinate represents power in kilowatts and the abscissa represents time. The diode limiters 40 and 42 are driven into the non-linear regions of the diodes to provide power limiting. As is well known, the field reflected from the diode limiters 40 and 42 increases the electric field across the discharge gap 34 which contains the radioactive tritium primed ignitor limiter and it begins to limit at its threshold RF power limit. The gas discharge medium power limiter 32 and the halogen-type gas limiter 14C are sequentially excited in a rearward direction. Because of the relatively fast rise time of the leading edge 54 of the RF input pulse, as is well known, the successive passage of the pulse through stages 14 and 16 will modify, as shown in FIG. 4, the RF input pulse to one having a leading edge spike 62 with a rise time from T1 to T2 and a fall from T2 to T3 on the order of 1–3 nanoseconds respectively and having a peak power on the order of 5 to 15 watts. The leading edge spike 62 is followed by a change to a flat-topped curve 64 from T3 to T6 having a peak power on the order of 1/1000 of the peak power of the spike 62 or on the order of 15 milliwatts. In FIG. 4 the ordinate represents power in watts and the abscissa represents time. Experimental investigations of receiver protector 10 by the inventor disclosed that the development of the spike 62 results in the concurrent development of a burst of electromagnetic energy containing a wide band of frequencies and, in the power amplitude of these frequencies, is large enough to damage a conventional low noise amplifier of the FET type.

Diode limiters 40 and 42 of stage 18 normally have a bandwidth of 1 GHz and consequently attenuate only the pulse frequencies within this band. These frequencies are referred to herein as the "in-band" frequencies. The pulse frequencies which extend below and above the "in-band" frequencies are referred to herein as the "out-of-band" frequencies. The energy in the "out-of-band" frequencies was also experimentally investigated by the inventor and these frequencies were determined to be associated with energies which were relatively strong and not attenuated by the diode limiters 40 and 42 of stage 18. The out-of-band energies consequently were not limited and could pass through and degrade the FET-type receiver.

Figure 5:
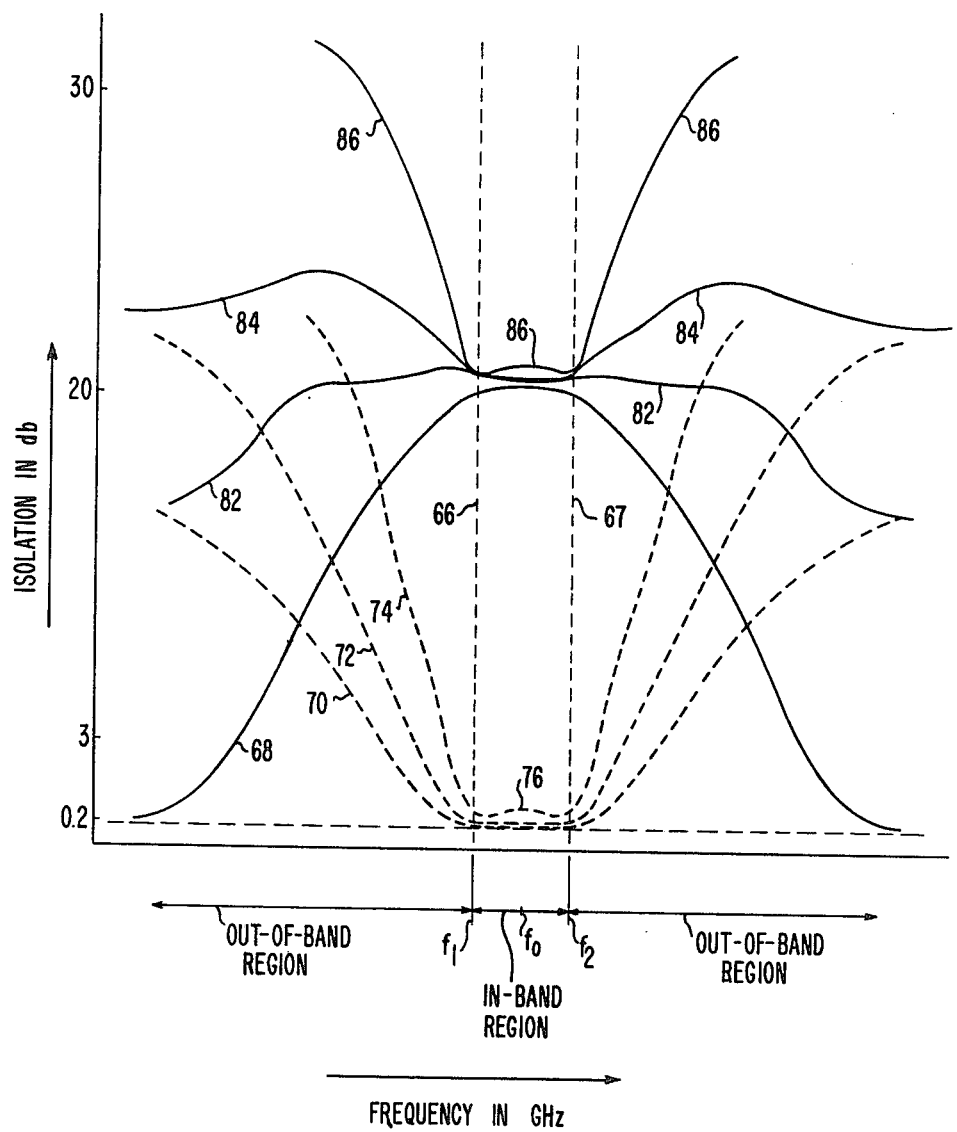
FIG. 5 is a graph showing the isolation of the "out-of-band" and the "in-band" regions of the transmitter pulse frequency bandwidth for a pair of diode limiters and one, two, and three iris filters, respectively.

FIG. 5 illustrates the bandwidth of in-band frequency band between lines 66 and 67 which is the range of frequencies from $f_1$ to $f_2$ over which the receiver is nominally designed to operate. In FIG. 5 the ordinate represents isolation in decibels and the abscissa represents frequency in GHz. The bandwidth of the in-band frequencies is on the order of 5% of the bandwidth of the out-of-band frequencies. Curve 68 is the attenuation curve for the pair of diode limiters 40 and 42 of stage 18 wherein the maximum attenuation as shown in FIG. 5 is in the in-band region. Curves 70, 72, and 74 are the attenuation curves for a single iris filter 44, for a pair of iris filters 44 and 46, and for three iris filters 44, 46, and 48 of stage 20 respectively, wherein the curve for the single iris filter 44 is relatively shallow with respect to the curves for the two and the three iris filters. In addition, the insertion loss for curves 70 and 72 is relatively small, being on the order of 0.2 dB within the in-band region. Investigation has shown that although the insertion loss for the 3-iris filter is also on the order of 0.2 dB within the in-band region there is a slight "hump" 76 or increase in the insertion loss on the order of 0.1–0.3 dB within the in-band region. Curves 82, 84, and 86 are derived from the summation of the isolation values over out-of-band and in-band frequencies of curve 68 with the respective values for curves 70, 72, and 74. Although there is no theoretical upper limit to the number of iris filters or diode limiters which may be employed, it is to be noted from curve 84 that a pair of iris filters combined with a pair of diodes limiters will result in an approximately uniform isolation of the energies in the in-band and out-of-band frequencies and that three-iris filters will provide an increased isolation of the energies only in the out-of-band frequencies. The single iris filter will not provide adequate isolation of the energies in the out-of-band frequency regions for some sensitive receivers.

Figure 6:
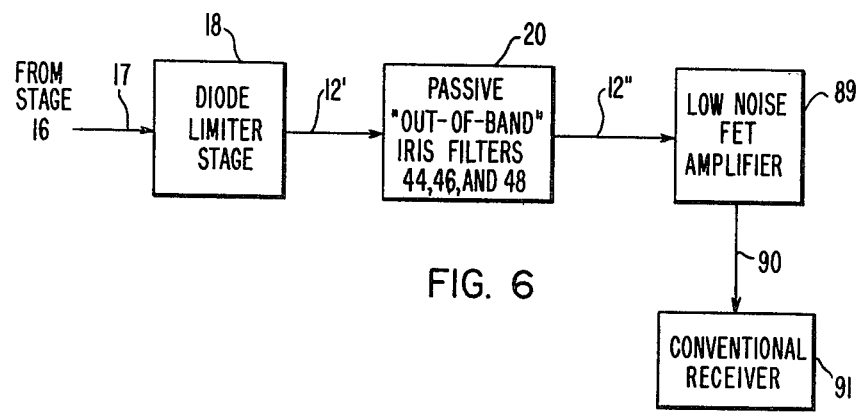
FIG. 6 is a block diagram of the invention of FIG. 1.

FIG. 6 is a block diagram of the invention showing the output of stage 20 coupled over waveguide 12″ to the input of low noise FET amplifier 89. The output of amplifier 89 is coupled over line 90 to an input of conventional receiver 91. In FIG. 6 like references are used for functions corresponding to the apparatus of FIG. 1.

Figure 7:
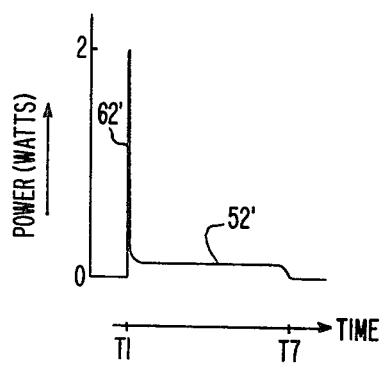
FIGS. 7 and 8 are waveforms illustrating the reduction of the pulse peak in passing through a pair of iris filters.
Figure 8:
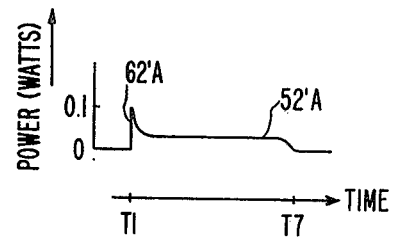

FIGS. 7 and 8 illustrate the effect of adding a triplet of iris filters 44, 46, and 48 of stage 20 of FIG. 6 between the diode limiters 40 and 42 of stage 18 and the low noise FET amplifier 89 which precedes conventional receiver 91. In FIGS. 7 and 8 the ordinate represents power in watts and the abscissa represents time. The spike 62′ in FIG. 7 in waveguide 12′ at arrow 12′ shown in FIG. 1 is reduced from an amplitude on the order of 2 watts to a spike 62′A in FIG. 8 in waveguide 12″ at arrow 47 in FIG. 1 having an amplitude on the order of 0.1 watt since the energies associated with the out-ofband frequencies are greatly attenuated by the triplet of passive iris filters 44, 46, and 48. The pulse flat top 52'A in FIG. 8 in waveguide 12" at arrow 47 in FIG. 1 is relatively unattenuated by the iris filters 44, 46, and 48 since the energies associated with flat top 52' principally within the in-band bandwidth of frequencies. Experimental results have verified that the addition of the passive iris filters 44, 46, and 48 to the diode limiters 40 and 42 of receiver protector 10 has reduced the leakage power to a safe level for sensitive low noise FET amplifiers such as, for example, those having a gate or channel length in the range from 0.2 to 1 micron and burnout at 100 milliwatts for 3 nanosecond spikes and 50 mw peak flat leakage.

I claim as my invention:

1. Apparatus for protecting a receiver from damage by microwave signals including pulses having rise times less than 10 nanoseconds which exceed a predetermined power level comprising:
   a waveguide suitable for propagating microwave signals of a predetermined electrical wavelength $\lambda_g$ having an input end and an output end;
   non-linear elements including a gas discharge limiter stage positioned in said waveguide for isolating from said output end energies associated with a first predetermined range of noise and microwave signal frequencies at times said microwave signals exceed said predetermined power level;
   first means positioned after non-linear elements in said waveguide for isolating from said output ends energies associated with said first predetermined range of noise and microwave signal frequencies; and
   second means positioned after said first means in said waveguide for isolating from said output end energies associated with a second and third predetermined range of noise signal frequencies outside said first predetermined range of frequencies whereby undesired noise signal frequencies generated by operation of said non-linear elements are isolated from said output end.

2. Apparatus in accordance with claim 1 wherein said first means includes at least one diode limiter disposed at a predetermined location from said non-linear elements.

3. Apparatus in accordance with claim 1 wherein said second means includes at least one iris plate filter spaced from said first means by a distance substantially equal to $(2N-1) \lambda_g/4$, where N is an integral number.

4. Apparatus in accordance with claim 1 wherein said microwave signals are substantially flat-top pulses having a leading edge rise-time on the order of 5 to 10 nanoseconds.

5. Apparatus in accordance with claim 1 wherein said first means includes a plurality of diode limiters spaced apart by a distance substantially equal to $(2N-1) \lambda_g/4$ where N is an integral number for each spacing.

6. Apparatus in accordance with claim 1 wherein said second means includes a plurality of iris plate filters spaced apart by a distance substantially equal to $(2N-1) \lambda_g/4$ where N is an integer for each spacing.

7. The apparatus of claim 1 wherein said first range of frequencies extends between said second and third range of frequencies.

8. Apparatus for protecting a receiver from damage by microwave signals having rise times less than 10 nanoseconds which exceeds a first predetermined power level comprising:
   a waveguide suitable for propagating microwave signals of a predetermined wavelength $\lambda_g$ having an input end and an output end;
   means for coupling a source of microwave signals to said input end;
   at least one gas discharge limiter stage positioned in said waveguide for forming a low impedance path across said waveguide at times said microwave signals exceed said first predetermined power level;
   first means positioned after said limiter stage in said waveguide for forming a low impedance path across said waveguide at times said microwave signals in a first microwave frequency range exceed a second predetermined power level, said first microwave frequency range including the microwave frequency of said predetermined wavelength; and
   second means positioned after said first means in said waveguide for forming a low impedance path across said waveguide to microwave signals in a second and third microwave frequency range outside said first microwave frequency range whereby microwave signals generated by non-linear response of said limiter stage having frequency components outside said first microwave frequency range and within said second and third microwave frequency ranges are attenuated before passing to said output end.

9. The apparatus of claim 1 or 8 wherein said receiver includes a low noise field effect transistor front end.

10. The apparatus of claim 1 or 8 wherein said receiver includes a field effect transistor front end which includes a field effect transistor having a channel length in the range from 0.2 to 1 micron.

11. Apparatus in accordance with claim 8 wherein said second means includes at least one iris plate filter spaced from said first means by a distance substantially equal to $(2N-1) \lambda_g/4$ where N is an integral number.

12. Apparatus in accordance with claim 8 wherein said second means includes a plurality of iris plate filters spaced apart by a distance substantially equal to $(2N-1) \lambda_g/4$ where N is an integral number for each spacing.

13. Apparatus in accordance with claim 11 wherein said iris plate filter includes a metal plate having a slot opening.

14. Apparatus in accordance with claim 8 wherein said first microwave frequency range extends between said second and third microwave frequency ranges.

* * * * *